United States Patent
Simon

(10) Patent No.: US 6,894,901 B2
(45) Date of Patent: May 17, 2005

(54) LIGHT SOURCE COMPRISING A LARGE NUMBER OF LIGHT-EMITTING DIODES

(75) Inventor: Ernst-Ulrich Simon, Oberursel/Ts. (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/029,403

(22) Filed: Dec. 20, 2001

(65) Prior Publication Data

US 2002/0093793 A1 Jul. 18, 2002

(30) Foreign Application Priority Data

Dec. 21, 2000 (DE) .......................................... 100 63 876

(51) Int. Cl.[7] .................................................. H05K 7/20
(52) U.S. Cl. ...................... 361/707; 361/720; 361/749; 362/294; 362/373
(58) Field of Search ................................ 257/707, 713, 257/81–82, 99–100; 361/704, 707, 709–710, 719–721, 749; 362/11, 373, 227, 218, 294

(56) References Cited

U.S. PATENT DOCUMENTS

| | | | | |
|---|---|---|---|---|
| 3,873,889 A | * | 3/1975 | Lejba ........................... | 361/749 |
| 4,729,076 A | * | 3/1988 | Masami et al. ............. | 362/294 |
| 4,792,879 A | * | 12/1988 | Bauknecht et al. ......... | 361/749 |
| 5,008,656 A | * | 4/1991 | Cheriff et al. ............... | 361/707 |
| 5,038,255 A | * | 8/1991 | Nishihashi et al. ......... | 362/373 |
| 5,162,696 A | | 11/1992 | Goodrich | |
| 5,173,839 A | * | 12/1992 | Metz, Jr. ..................... | 361/707 |
| 5,632,551 A | | 5/1997 | Roney et al. | |
| 6,045,240 A | * | 4/2000 | Hochstein ................... | 362/294 |
| 6,367,949 B1 | * | 4/2002 | Pederson ..................... | 362/373 |
| 6,402,347 B1 | * | 6/2002 | Mass et al. .................. | 362/294 |

FOREIGN PATENT DOCUMENTS

| | | |
|---|---|---|
| DE | 3813565 | 11/1989 |
| DE | 3835942 | 4/1990 |
| DE | 4326029 | 2/1995 |
| DE | 19528459 | 2/1997 |
| DE | 19621148 | 12/1997 |
| DE | 20011330 | 10/2000 |
| EP | 0921568 | 6/1999 |

* cited by examiner

Primary Examiner—Gregory D. Thompson
(74) Attorney, Agent, or Firm—Martin A. Farber

(57) ABSTRACT

A light source is described, which is composed of a large number of light-emitting diodes (7) in an array arrangement. The light source comprises a mounting board (2) on which a flexible printed circuit (4) is adhesively bonded, on whose free surface a large number of light-emitting diodes (7) are mounted. Their lines (8) make contact with contact pads (10) at the ends of conductor tracks (9) on the flexible printed circuit (4).

3 Claims, 1 Drawing Sheet

LIGHT SOURCE COMPRISING A LARGE NUMBER OF LIGHT-EMITTING DIODES

FIELD AND BACKGROUND OF THE INVENTION

In order to provide sufficient light intensities for indicators, displays, back lighting in vehicles, illumination for indication instruments, etc., it has already been proposed for a number of light-emitting diodes to be combined to form what is referred to as an array. In a light source such as this, the light-emitting diodes (LEDs) are located on the mount, which is also provided with a number of contact pads, which make electrical contact with the light-emitting diodes.

A mount populated in such a way is placed, for example, on a solid printed circuit board, which is provided with equivalent contact points. In order to produce the electrical connection, connection elements must be used between the contact pads on the mount and the contact surfaces on the printed circuit board. making electrically conductive contact with the contact pads. Each connection thus has two junction points, namely one on the mount and the other on the printed circuit board. Furthermore, the light-emitting diodes must be connected to the contact pads on the mount. The wiring is thus very complex.

The invention is thus based on the problem of providing a light source which is of simple construction and can be integrated as easily as possible in a light, under a display, in an optical system or in some other appliance configuration.

SUMMARY OF THE INVENTION

The invention therefore proposes that the light-emitting diodes be mounted alongside one another on one face of a flexible printed circuit board, and the electrically conductively connected conductor tracks on the flexible printed circuit board.

This arrangement has the advantage that the light-emitting diodes can be connected directly to the current-carrying lines on the flexible printed circuit board. This therefore reduces the number of connections to be produced.

In order to make the arrangement mechanically robust, it is particularly advantageous to mount the flexible printed circuit board on a robust mount, which is at the same time used to dissipate the heat produced by the light-emitting diodes. To this end, this mount is preferably composed of a thermally conductive material, for example copper, and is possibly connected to a heat sink, or is in the form of such a heat sink.

The flexible printed circuit board on which the light-emitting diodes are mounted is connected to the mount in a simple manner by means of thermally conductive adhesive.

The electrical connection between the light-emitting diodes and the current-carrying liner on the flexible printed circuit board is produced via contact pads, with electrical contacts being made between the LEDs and the flexible printed circuit board The light-emitting diodes can be integrated individually or as a group of a number of them in the semiconductor chip, in which case sections of the chip can be doped appropriately (also differently) . Furthermore, the semiconductor chip may have a corresponding number of contact pads, via which the Light-emitting diode section or sections is or are supplied with power. When using such semiconductors, only the contact pads on the chip need to be electrically conductively connected to the corresponding contact pads on the flexible printed circuit board.

This connection can be produced by soldering, bonding or adhesive bonding. The term bonding refers to a specific welding process, which is known per se, and which has been proven for populating printed circuits boards with electronic components and which is carried out here specifically on the pads on the flexible printed circuit board.

In order to make the arrangement robust, the invention also proposes that the light-emitting diodes be arranged in an encapsulation compound, which preferably extends to such an extent that only the light outlet surfaces remain free. This results in a mechanical, extremely robust arrangement. Power is supplied to the light-emitting diodes via the conductor track on the flexible printed circuit board, which projects out of the encapsulation compound at the side and can be connected to a rigid printed circuit board via known connector systems.

The invention will be explained in more detail in the following text with reference to an exemplary embodiment. In the figures:

DETAILED DESCRIPTION OF THE PREFERRED EMBODIMENT

Figure 1:
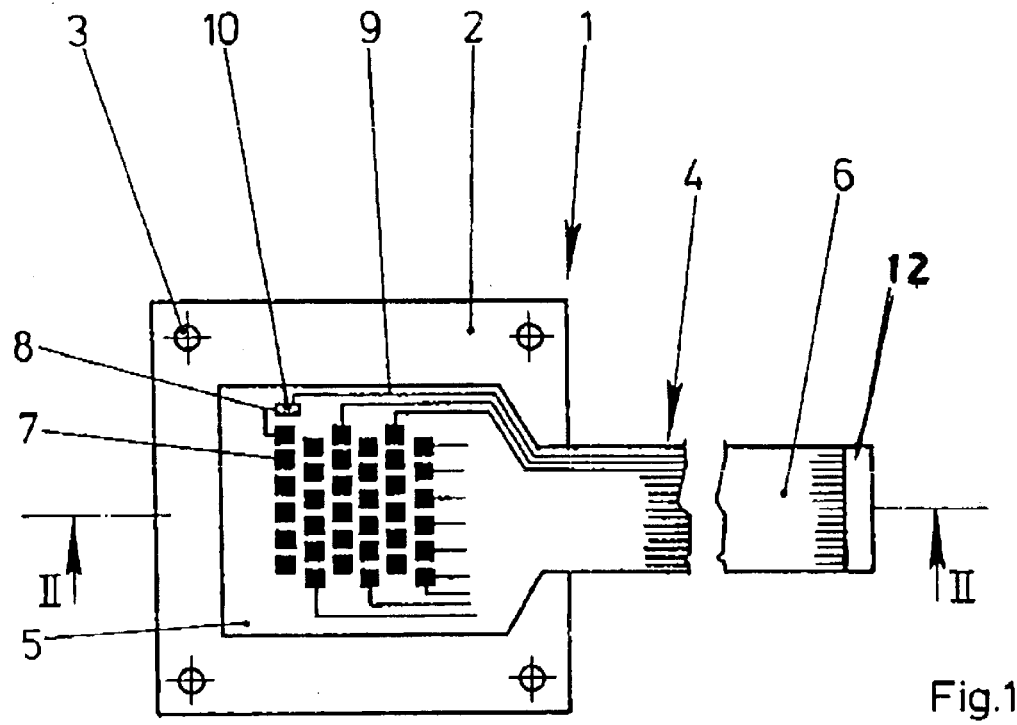
FIG. 1 shows a plan view of a light-emitting diode array.

There are boreholes 3 in the corners of the mounting board 2, using which the mounting board 2 can be mounted at a suitable position. A flexible printed circuit board 4 is adhesively bonded to one side face, and has a square accommodation area 5 and a supply line area 6 in the form of a strip. Up to 100 light emitting diodes 7 are adhesively bonded onto the accommodation area 5, and are represented here only as small square surfaces. These are connected t) the conductor tracks 9 via lines 8, of which only a few are illustrated. The connection is made via small contact pads 10, one of which is illustrated schematically. The conductor track 9 and contact pads 10 are pert of the flexible printed circuit board 4. The illustration of the contact pad 10 and of the line 9 which is a thin wire composed of aluminum or gold, is highly magnified.

The accommodation area 5 has a number of contact pads 10 corresponding to the number of light-emitting diodes. These contact pads 10 are arranged such that electrical contact can be made in a simple manner. In order to supply power to the light-emitting diodes 7, the lines 3 are connected firstly to contact pads-which are not shown in any more detail here because they are so small-on the light-emitting diodes, and to the contact pads 10 on the flexible printed circuit board 4.

The bonding process has been particularly proven for connection, in which the lines a are welded to the contact pads 10 on the flexible printed circuit board 4. This process can be used particularly well when it is necessary to produce a large number of electrically conductive contacts in a very confined space.

Figure 2:
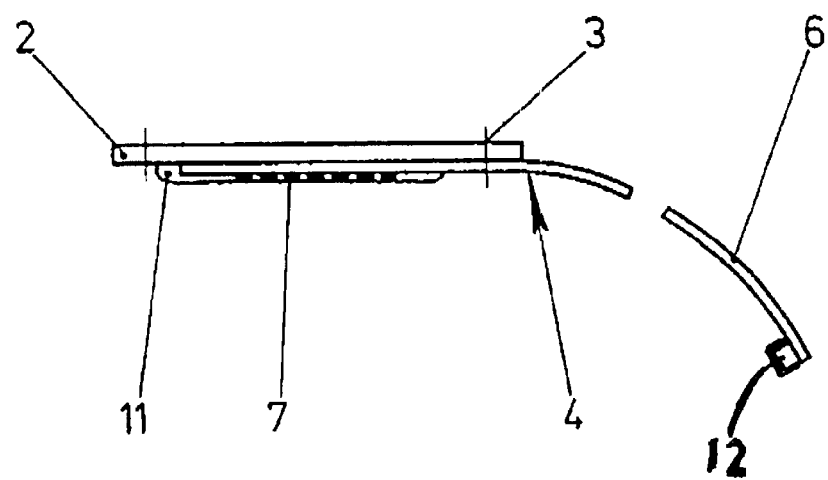
FIG. 2 shows a section along the line II—II.

The flexible printed circuit board 4 which has been populated in this way is adhesively bonded onto the mounting board 2 using a thermally conductive paste. The area of the light-emitting diodes 7 is then surrounded by an encapsulation compound 11, which provides further robustness for the arrangement. As is illustrated schematically in FIG. 2, the encapsulation compound 11 extends over the edge of the flexible printed circuit board 4 and as far as the upper edge of the light-emitting diodes 7, so that only the light outlet surfaces of the light-emitting diodes 7 remain free. The encapsulation compound 11 makes the arrangement robust, and protects against damage.

As both figures show, the supply line area 6 on the flexible printed circuit board 4 projects at the sides. A plug 12 (FIG. 2) can be attached to its free end, so that it is possible to produce a connection to a socket on a rigid printed circuit board.

The arrangement has the advantage that a large number of light-emitting diodes 7 can be supplied with power via a common line-this being the supply line area 6 on the flexible printed circuit board 4. The process of making contact with the light-emitting diodes 7 is considerably simplified, since the lines 8 of the light-emitting diodes 7 just need to be linked to contact pads 10 on the flexible printed circuit board 4. The thermally conductive mounting board 2 also results in the entire light source having a good thermal budget.

I claim:

1. A light source comprising a large number of light-emitting diodes, wherein the light-emitting diodes (7) are mounted alongside one another on one face of a flexible printed circuit board (4), and are electrically conductively connected to conductor tracks (9) on the flexible printed circuit board (4), and wherein the flexible printed circuit board (4) is mounted with that face which is opposite the light-emitting diodes (7) on a stable mounting board (2) for heat dissipation, and the flexible printed circuit board projects at one side beyond the mounting board (2), and wherein the conductor tracks are located on the printed circuit board with the light-emitting diodes being disposed along said one face of the printed circuit board.

2. The light source as claimed in claim 1, further comprising a plug attachable to a flexible free end of said one side.

3. A light source comprising a large number of light-emitting diodes, wherein the light-emitting diodes (7) are mounted alongside one another on one face of a flexible printed circuit board (4), and are electrically conductively connected to conductor tracks (9) on the flexible printed circuit board (4), wherein the flexible printed circuit board (4) is mounted with that face which is opposite the light-emitting diodes (7) on a stable mounting board (2) for heat dissipation, and the mounting board (2) is composed of thermally conductive material, and wherein the printed circuit board projects from a side of the mounting board, the part of the printed circuit board, which projects from the side of the mounting board forms a projected part with an end opposite to the mounting board, and a plug connection is on the end of the projected part.

* * * * *